(12) United States Patent
Wang et al.

(10) Patent No.: US 9,015,547 B2
(45) Date of Patent: Apr. 21, 2015

(54) MULTI-LEVEL LDPC LAYERED DECODER WITH OUT-OF-ORDER PROCESSING

(75) Inventors: Chung-Li Wang, San Jose, CA (US); Shaohua Yang, San Jose, CA (US); Zongwang Li, San Jose, CA (US); Fan Zhang, Milpitas, CA (US)

(73) Assignee: LSI Corporation, Milpitas, CA (US)

( * ) Notice: Subject to any disclaimer, the term of this patent is extended or adjusted under 35 U.S.C. 154(b) by 187 days.

(21) Appl. No.: 13/588,648

(22) Filed: Aug. 17, 2012

(65) Prior Publication Data

US 2014/0053037 A1 Feb. 20, 2014

(51) Int. Cl.
*H03M 13/00* (2006.01)
*H03M 13/13* (2006.01)
*G11B 20/22* (2006.01)
*H03M 13/11* (2006.01)
*G11B 20/18* (2006.01)
*H03M 13/29* (2006.01)

(52) U.S. Cl.
CPC ............ *H03M 13/13* (2013.01); *G11B 20/22* (2013.01); *H03M 13/1117* (2013.01); *H03M 13/116* (2013.01); *H03M 13/1171* (2013.01); *H03M 13/2957* (2013.01); *H03M 13/6325* (2013.01); *H03M 13/6343* (2013.01); *H03M 13/6583* (2013.01); *H03M 13/6591* (2013.01); *G11B 20/1833* (2013.01); *G11B 2020/185* (2013.01)

(58) Field of Classification Search
None
See application file for complete search history.

(56) References Cited

U.S. PATENT DOCUMENTS

| | | | |
|---|---|---|---|
| 6,771,197 B1 * | 8/2004 | Yedidia et al. | 341/107 |
| 8,291,292 B1 | 10/2012 | Varnica | |
| 8,407,567 B2 | 3/2013 | Gunnam | |
| 8,418,023 B2 | 4/2013 | Gunnam | |
| 8,495,449 B2 | 7/2013 | Gunnam | |
| 8,555,140 B2 | 10/2013 | Gunnam | |
| 2010/0042890 A1 * | 2/2010 | Gunnam | 714/752 |
| 2011/0252294 A1 * | 10/2011 | Ng et al. | 714/804 |
| 2013/0275827 A1 * | 10/2013 | Wang et al. | 714/752 |

OTHER PUBLICATIONS

Declercq, "Decoding Algorithms for Nonbinary LDPC Codes over GF(q)", IEEE Trans. on Commun., vol. 55(4), pp. 633-643 (Apr. 2007).
U.S. Appl. No. 13/251,340, filed Oct. 3, 20111, Haitao Xia, Unpublished.
U.S. Appl. No. 13/274,443, filed Oct. 17, 2011, Chung-Li Wang, Unpublished.
U.S. Appl. No. 13/167,764, filed Jun. 24, 2011, Zongwang Li, Unpublished.
U.S. Appl. No. 13/227,538, filed Sep. 8, 2011, Shaohua Yang, Unpublished.

(Continued)

*Primary Examiner* — Daniel McMahon
(74) *Attorney, Agent, or Firm* — Hamilton DeSanctis & Cha

(57) ABSTRACT

An apparatus for low density parity check decoding includes a variable node processor operable to generate variable node to check node messages and to calculate perceived values based on check node to variable node messages, a check node processor operable to generate the check node to variable node messages and to calculate checksums based on the variable node to check node messages, and a scheduler operable to determine a layer processing order for the variable node processor and the check node processor based at least in part on the number of unsatisfied parity checks for each of the H matrix layers.

20 Claims, 4 Drawing Sheets

(56) References Cited

OTHER PUBLICATIONS

U.S. Appl. No. 13/180,495, filed Jul. 11, 2011, Chung-Li Wang, Unpublished.
U.S. Appl. No. 13/284,826, filed Oct. 28, 2011, Weijun Tan, Unpublished.
U.S. Appl. No. 13/539,657, filed Jul. 2, 2012, Fan Zhang, Unpublished.
U.S. Appl. No. 13/539,639, filed Jul. 2, 2012, Fan Zhang, Unpublished.
U.S. Appl. No. 13/445,834, filed Apr. 12, 2012, Chung-Li Wang, Unpublished.
Wymeersch et al., "Log-Domain Decoding of LDPC Codes Over GF(q)", IEEE Int. Conf. on Commun., vol. 2, pp. 772-776 (Jun. 2004).
Zhao, "Joint Detection/Decoding Algorithms for Nonbinary LDPC Codes over ISI Channels" [online] [ret. On Nov. 9, 2012] Ret. From Internet: http://arxiv.org/abs/1209.2542v1.

\* cited by examiner

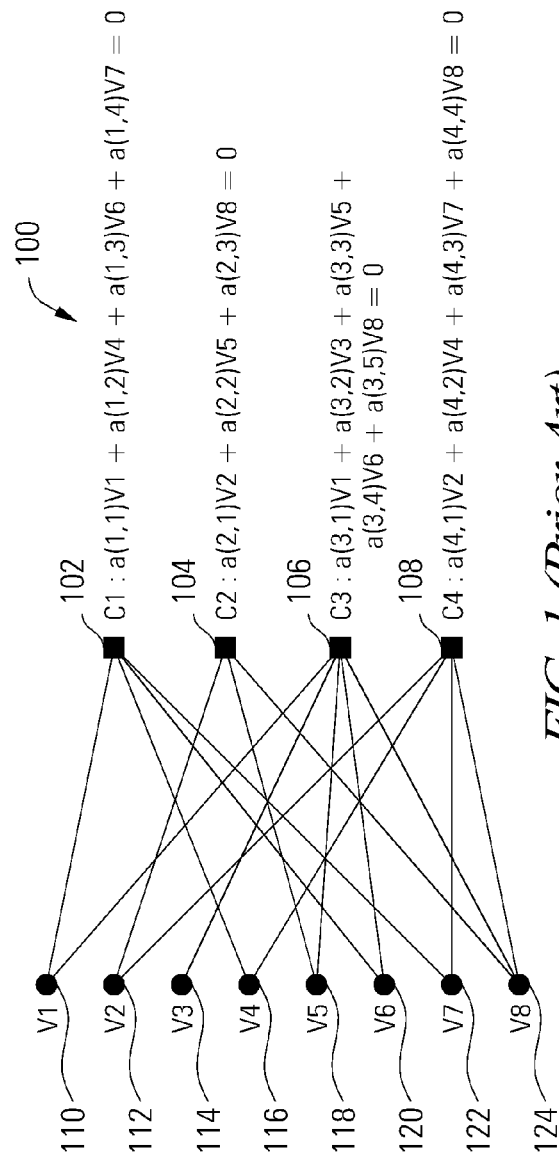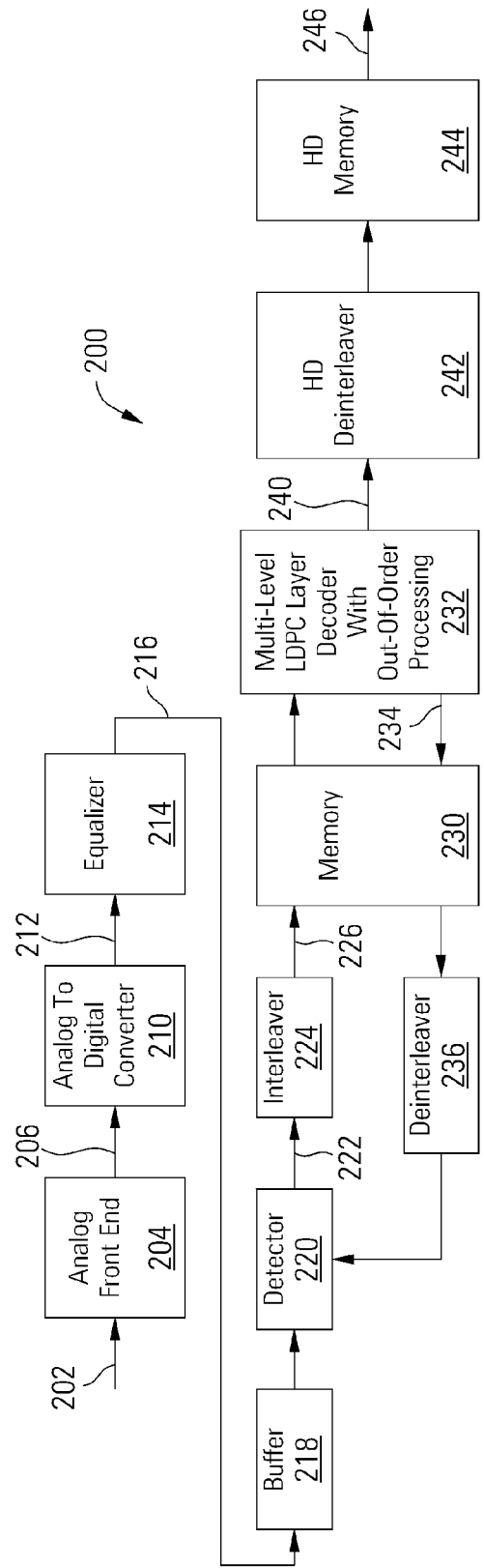

MULTI-LEVEL LDPC LAYERED DECODER WITH OUT-OF-ORDER PROCESSING

BACKGROUND

Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. As information is stored and transmitted in the form of digital data, errors may be introduced that, if not corrected, can corrupt the data and render the information unusable. The effectiveness of any transfer is impacted by any losses in data caused by various factors. Many types of error checking systems have been developed to detect and correct errors in digital data. For example, in perhaps the simplest system, a parity bit can be added to a group of data bits, ensuring that the group of data bits (including the parity bit) has either an even or odd number of ones. When using odd parity, as the data is prepared for storage or transmission, the number of data bits in the group that are set to one are counted, and if there is an even number of ones in the group, the parity bit is set to one to ensure that the group has an odd number of ones. If there is an odd number of ones in the group, the parity bit is set to zero to ensure that the group has an odd number of ones. After the data is retrieved from storage or received from transmission, the parity can again be checked, and if the group has an even parity, at least one error has been introduced in the data. At this simplistic level, some errors can be detected but not corrected.

The parity bit may also be used in error correction systems, including in LDPC decoders. An LDPC code is a parity-based code that can be visually represented in a Tanner graph 100 as illustrated in FIG. 1. In an LDPC decoder, multiple parity checks are performed in a number of check nodes 102, 104, 106 and 108 for a group of variable nodes 110, 112, 114, 116, 118, 120, 122, and 124. The connections (or edges) between variable nodes 110-124 and check nodes 102-108 are selected as the LDPC code is designed, balancing the strength of the code against the complexity of the decoder required to execute the LDPC code as data is obtained. The number and placement of parity bits in the group are selected as the LDPC code is designed. Messages are passed between connected variable nodes 110-124 and check nodes 102-108 in an iterative process, passing beliefs about the values that should appear in variable nodes 110-124 to connected check nodes 102-108. Parity checks are performed in the check nodes 102-108 based on the messages and the results are returned to connected variable nodes 110-124 to update the beliefs if necessary. LDPC decoders may be implemented in binary or non-binary fashion. In a binary LDPC decoder, variable nodes 110-124 contain scalar values based on a group of data and parity bits that are retrieved from a storage device, received by a transmission system or obtained in some other way. Messages in the binary LDPC decoders are scalar values transmitted as plain-likelihood probability values or log-likelihood-ratio (LLR) values representing the probability that the sending variable node contains a particular value. In a non-binary LDPC decoder, variable nodes 110-124 contain symbols from a Galois Field, a finite field $GF(p^k)$ that contains a finite number of elements, characterized by size $p^k$ where p is a prime number and k is a positive integer. Messages in the non-binary LDPC decoders are multi-dimensional vectors, generally either plain-likelihood probability vectors or LLR vectors.

The connections between variable nodes 110-124 and check nodes 102-108 may be presented in matrix form as follows, where columns represent variable nodes, rows represent check nodes, and a random non-zero element a(i,j) from the Galois Field at the intersection of a variable node column and a check node row indicates a connection between that variable node and check node and provides a permutation for messages between that variable node and check node:

$$H = \begin{bmatrix} a(1,1) & 0 & 0 & a(1,2) & 0 & a(1,3) & a(1,4) & 0 \\ 0 & a(2,1) & 0 & 0 & a(2,2) & 0 & 0 & a(2,3) \\ a(3,1) & 0 & a(3,2) & 0 & a(3,3) & a(3,4) & 0 & a(3,5) \\ 0 & a(4,1) & 0 & a(4,2) & 0 & 0 & a(4,3) & a(4,4) \end{bmatrix}$$

By providing multiple check nodes 102-108 for the group of variable nodes 110-124, redundancy in error checking is provided, enabling errors to be corrected as well as detected. Each check node 102-108 performs a parity check on bits or symbols passed as messages from its neighboring (or connected) variable nodes. In the example LDPC code corresponding to the Tanner graph 100 of FIG. 1, check node 102 checks the parity of variable nodes 110, 116, 120 and 122. Values are passed back and forth between connected variable nodes 110-124 and check nodes 102-108 in an iterative process until the LDPC code converges on a value for the group of data and parity bits in the variable nodes 110-124. For example, variable node 110 passes messages to check nodes 102 and 106. Check node 102 passes messages back to variable nodes 110, 116, 120 and 122. The messages between variable nodes 110-124 and check nodes 102-108 are probabilities or beliefs, thus the LDPC decoding algorithm is also referred to as a belief propagation algorithm. Each message from a node represents the probability that a bit or symbol has a certain value based on the current value of the node and on previous messages to the node.

A message from a variable node to any particular neighboring check node is computed using any of a number of algorithms based on the current value of the variable node and the last messages to the variable node from neighboring check nodes, except that the last message from that particular check node is omitted from the calculation to prevent positive feedback. Similarly, a message from a check node to any particular neighboring variable node is computed based on the current value of the check node and the last messages to the check node from neighboring variable nodes, except that the last message from that particular variable node is omitted from the calculation to prevent positive feedback. As iterations are performed in the system, messages pass back and forth between variable nodes 110-124 and check nodes 102-108, with the values in the nodes 102-124 being adjusted based on the messages that are passed, until the values converge and stop changing or until processing is halted.

BRIEF SUMMARY

Various embodiments of the present invention are related to methods and apparatuses for decoding data, and more particularly to methods and apparatuses for multi-level layered LDPC decoding with out-of-order processing. For example, in one embodiment an apparatus includes a variable node processor and a check node processor. The variable node processor is operable to generate variable node to check node messages and to calculate perceived values based on check node to variable node messages. The check node processor is operable to generate the check node to variable node messages and to calculate checksums based on variable node to check node messages. The check node processor includes a min finder circuit operable to identify a minimum, a next minimum and an index of minimum value in the variable node to check node messages. The variable node processor and check node processor are operable to perform layered multi-level decoding.

The order in which layers (or rows) in the H-matrix for the LDPC code are processed is based at least in part on the number of unsatisfied parity checks for each layer. In some embodiments, the number of unsatisfied parity checks is calculated for each layer at the beginning of a decoding iteration, such that layers with the most unsatisfied parity checks are processed first. In other embodiments, layers with the fewest unsatisfied parity checks are processed first.

Each layer is processed column by column, processing non-zero entries (or circulants) in H-matrix columns. The order in which circulants are processed for a layer is based at least in part on the circulants in the previously processed layer. Circulants with no dependencies on the previous layer are processed first in order to prevent delays before check node messages from the previous layer are available. In some embodiments, the circulant processing order for each pair of previous and current layers is determined and stored in the LDPC decoder.

In some embodiments, the LDPC decoder has a low bit-width architecture in which the check node processing has a smaller bit-width than the variable node processing, reducing the memory requirements for the decoder.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals may be used throughout several drawings to refer to similar components.

FIG. 1 depicts a Tanner graph of an example prior art LDPC code;

FIG. 2 depicts a block diagram of a read channel including a multi-level LDPC layered decoder with out-of-order processing which may be used to retrieve or receive stored or transmitted data in accordance with various embodiments of the present invention;

DETAILED DESCRIPTION OF THE INVENTION

Figure 3:
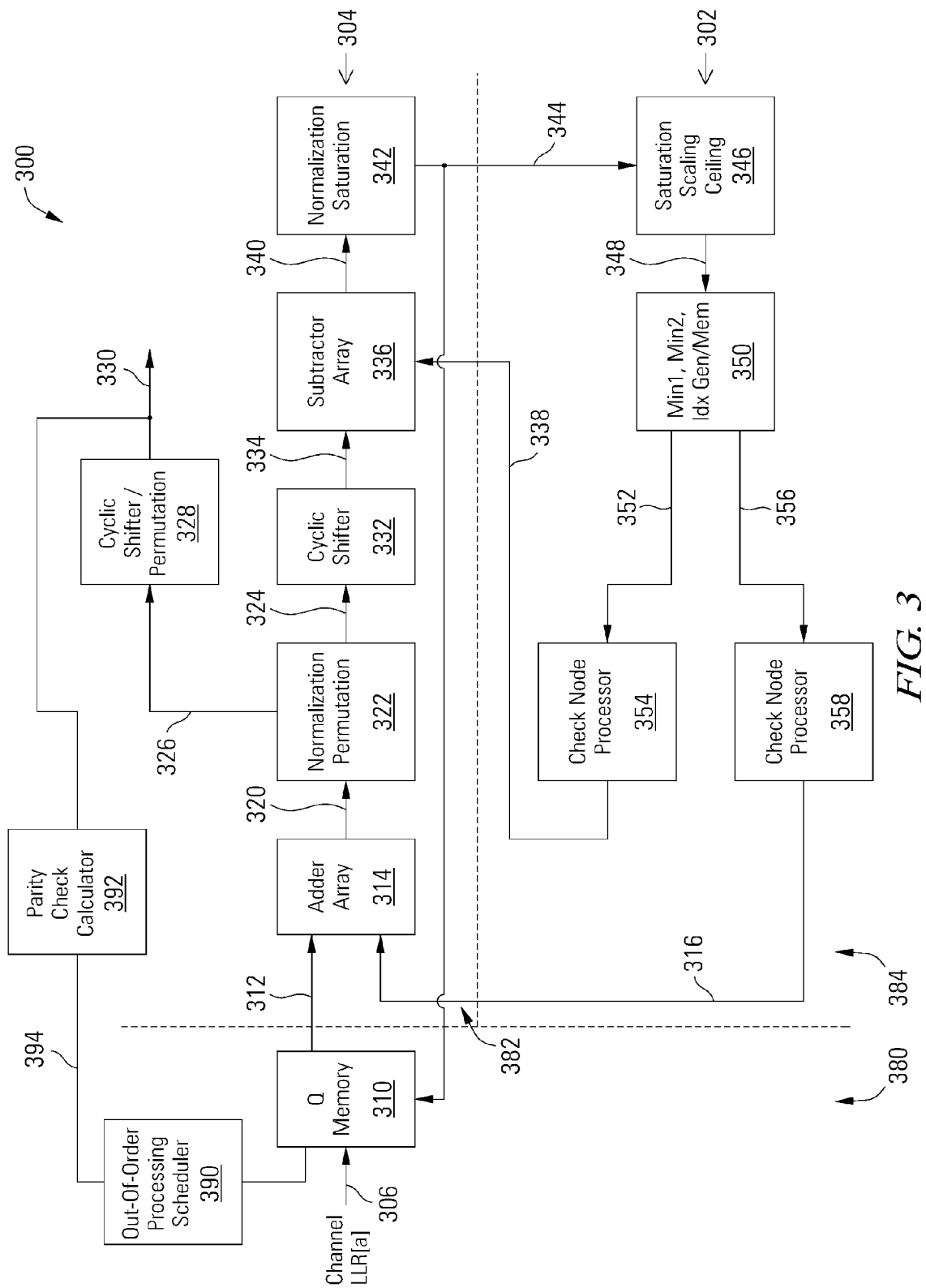
FIG. 3 depicts a block diagram of a multi-level LDPC layer decoder with out-of-order processing and low bit-width architecture in accordance with various embodiments of the present invention.

Various embodiments of the present invention are related to methods and apparatuses for decoding data, and more particularly to methods and apparatuses for decoding data in a multi-level LDPC layer decoder with out-of-order processing. The order in which layers (or rows) in the H-matrix for the LDPC code are processed is based at least in part on the number of unsatisfied parity checks for each layer. In some embodiments, the number of unsatisfied parity checks is calculated for each layer at the beginning of a decoding iteration, such that layers with the most unsatisfied parity checks are processed first. By processing layers in decreasing order of unsatisfied parity checks, data convergence is achieved more rapidly and error performance is improved. In other embodiments, layers with the fewest unsatisfied parity checks are processed first.

Each layer is processed column by column, processing non-zero entries (or circulants) in H-matrix columns. The order in which circulants are processed for a layer is based at least in part on the circulants in the previously processed layer. Because the decoder may begin processing one layer before completing processing the previous layer, data dependencies between layers may introduce delays in processing. To avoid these delays, circulants with no dependencies on the previous layer are processed first, beginning the processing with columns that do not overlap the previous layer in order to prevent delays before check node messages from the previous layer are available. Thus the check node processor does not need to wait until messages from the last layer are ready, decreasing latency between layers. In some embodiments, the circulant processing order for each pair of previous and current layers is determined and stored in the LDPC decoder.

In some embodiments, the LDPC decoder has a low bit-width architecture in which the check node processing has a smaller bit-width than the variable node processing, reducing the memory requirements for the decoder.

The multi-level LDPC layer decoder uses quasi-cyclic LDPC codes in which the parity check H matrix is an array of circulant sub-matrices, cyclically shifted versions of identity matrices and null matrices with different cyclical shifts. In some embodiments, the base H matrix is a 10×10$^9$ matrix with the form:

$$H = \begin{bmatrix} P(1,1) & P(1,2) & \ldots & P(1,j) & \ldots & P(1,L) \\ P(2,1) & P(2,2) & \ldots & P(2,j) & \ldots & P(2,L) \\ \vdots & \vdots & \ldots & \vdots & \ldots & \vdots \\ P(10,1) & P(10,2) & \ldots & P(10,j) & \ldots & P(10,L) \end{bmatrix}$$

Each P(i,j) is either a p×p circulant with weight 1 (a permutation of an identity matrix) or a zero matrix. In some embodiments, the total weight for a block column is 3. The p×p circulants P(i,j) have the form:

$$P_{i,j} = \begin{bmatrix} 0 & \alpha & 0 & \ldots & 0 \\ 0 & 0 & \alpha & \ldots & 0 \\ \vdots & \vdots & \vdots & \ddots & \vdots \\ 0 & 0 & 0 & \ldots & \alpha \\ \alpha & 0 & 0 & \ldots & 0 \end{bmatrix}$$

For example, given a 10×109 H matrix of 48×48 circulants, the overall row length is 109×48 or 5232, and the overall column height is 10×48 or 480. In the multi-level LDPC layer decoder with out-of-order processing, the parity check H matrix of the LDPC code is partitioned into L layers, with the H matrix being processed row by row and the circulants being processed layer by layer. As the rows are processed, the column results are updated based on each row result. Layered decoding can reduce the time to converge on a result in the decoder in some cases.

At the beginning of each local decoding iteration in the multi-level LDPC layer decoder with out-of-order processing, the number of unsatisfied parity checks are calculated for each layer of the H matrix, and the results are sorted. In some embodiments, the number of unsatisfied parity checks for each layer are sorted in descending order, with the layer having the most unsatisfied parity checks being first. The layer processing order is thus determined dynamically for each decoding iteration based at least in part on the number of unsatisfied parity checks. By processing the layers with the most unsatisfied parity checks first, convergence speed is improved, because the unsatisfied check nodes provide the messages that correct the errors. The layers (or rows) of the H matrix are processed in the sorted order. The processing of each row may begin before the processing is complete for the previous layer. In order to prevent delays due to inter-layer dependencies, the circulants in a layer that have no dependencies to the previous layer are processed before the circulants that are dependent on the previous layer, thereby reducing processing latency.

As an example of this prioritized layer processing and reduced-dependency circulant processing, consider the following simplified H matrix, where each P(i,j) is a non-zero circulant in row i and column j:

$$H = \begin{bmatrix} P(1,1) & 0 & 0 & 0 & P(1,5) & 0 \\ 0 & P(2,2) & P(2,3) & 0 & 0 & P(2,6) \\ P(3,1) & P(3,2) & 0 & P(3,4) & 0 & 0 \\ P(4,1) & 0 & P(4,3) & P(4,4) & P(4,5) & P(4,6) \end{bmatrix}$$

If the sorted numbers of unsatisfied parity checks for the four layers at the beginning of the local decoding iterations orders the layers as 1, 4, 3, 2, with layer 1 having the most unsatisfied parity checks and layer 2 having the fewest, the decoding operation will begin with layer 1. While processing each layer or row, only the columns with non-zero circulants are processed, skipping the unconnected columns with zero values. In some embodiments the first layer to be processed, in this example row 1, is processed in the natural column order of 1 through 6. Layer 1 has only two non-zero circulants, P(1,1) and P(1,5), processed in that order.

In this example, layer 4 has the next greatest number of unsatisfied parity checks and is therefore processed next. Note that circulant P(4,1) has a dependency to circulant P(1,1) in previously processed layer 1, and circulant P(4,5) has a dependency to circulant P(1,5) in previously processed layer 1. Because processing of layer 4 may begin before processing of layer 1 is completed, C2V messages related to circulants P(1,1) and P(1,5) may not be available when processing of layer 4 begins.

The circulants of a layer are divided into two groups, a first group with no dependencies to the previously processed layer and a second group with dependencies to the previously processed layer. In this example, if layer 4 is the currently processed layer and layer 1 is the previously processed layer, the group with dependencies includes circulants P(4,1) and P(4,5). The group without dependences includes circulants P(4,3), P(4,4) and P(4,6). The group without dependencies is processed first, and the group with dependencies is processed next. The circulants within each group are processed in natural order or in any order desired. In other embodiments, the circulant processing order may be changed to any desired order as soon as it is determined that the C2V messages for the previous layer are available.

Given the present example, the circulants or columns of layer 4 are processed in order 3, 4, 6, 1, 5. Layer 3 has the next largest number of unsatisfied parity checks, and the circulants of layer 3 are processed in order 2, 1, 4. Layer 2 has the least unsatisfied parity checks and is therefore processed last, with the circulants of layer 2 processed in order 3, 6, 2.

Because the layer processing order may be dynamically determined based on the number of unsatisfied parity checks for each layer, the dependencies between the circulants in the currently selected layer and the previously processed may vary based on which layer was previously processed. For example, if layer 4 is processed after layer 2 in the example above, the circulant processing order is 1, 4, 5, 3, 6 because of the dependency to circulants P(2,3) and P(2,6). The circulant processing order for each previous and current pair of layers may be determined in advance based on the H matrix design, and designed into the LDPC decoder or stored in a memory such as a read only memory (ROM) in the LDPC decoder. During decoding iterations, the column processing order is retrieved from the ROM for the current layer based on the dynamically determined layer processing order. In other words, the column processing order between all pairs of layers is stored in the ROM.

In summary, the layer processing order is dynamically determined based at least in part on the number of unsatisfied checks, for example processing layers with more unsatisfied parity checks first, thereby increasing convergence speed. Within that layer processing order, the circulant processing order is determined, for example by retrieving a predetermined order from a ROM, in order to first process the circulants that are not connected to the previously processed layer before processing circulants that are connected to the previously processed layer. Within those groups, circulants may be processed in any order, for example in order of column number.

Although the multi-level LDPC layer decoder with out-of-order processing is not limited to any particular LDPC decoding algorithm, in some embodiments the decoder performs min-sum based layered decoding of non-binary LDPC codes. Such min-sum based decoding provides low-complexity decoding over large Galois Fields and does not require forward and backward recursions, sorting or dynamic programming. In the min-sum based decoding, also referred to as simplified min-sum decoding, the check nodes calculate the minimum sub-message $min_1(d)$, the index $idx(d)$ of $min_1$), and the sub-minimum or next minimum sub-message $min_2(d)$, or minimum of all sub-messages excluding $min_1$), for each nonzero symbol d in the Galois Field based on all extrinsic V2C messages from neighboring variable nodes. In other words, the sub-messages for a particular symbol d are gathered from messages from all extrinsic inputs, and the $min_1$), $idx(d)$ and $min_2(d)$ is calculated based on the gathered sub-messages for that symbol d. For a Galois Field with q symbols, the check node will calculate the $min_1(d)$, $idx(d)$ and $min_2(d)$ sub-message for each of the q−1 non-zero symbols in the field except the most likely symbol. The $min_1(d)$, $idx(d)$ and $min_2(d)$ values are stored in a memory for use in calculating the C2V message, requiring much less memory than the traditional non-binary LDPC check node processor that stores each intermediate forward and backward message. An example of the simplified min-sum decoding is provided for a multi-level non-layer LDPC decoder in U.S. patent application Ser. No. 13/180,495 filed on Jul. 11, 2011 for a "Min- Sum Based Non-Binary LDPC Decoder", which is incorporated by reference herein for all purposes.

Although the multi-level LDPC layer decoder with out-of-order processing disclosed herein is not limited to any particular application, several examples of applications are presented herein that benefit from embodiments of the present invention. Turning to FIG. 2, a read channel 200 is used to process an analog signal 202 and to retrieve user data bits from the analog signal 202 without errors. In some cases, analog signal 202 is derived from a read/write head assembly in a magnetic storage medium. In other cases, analog signal 202 is derived from a receiver circuit that is operable to receive a signal from a transmission medium. The transmission medium may be wireless or wired such as, but not limited to, cable or optical connectivity. Based upon the disclosure provided herein, one of ordinary skill in the art will recognize a variety of sources from which analog signal 202 may be derived.

The read channel 200 includes an analog front end 204 that receives and processes the analog signal 202. Analog front end 204 may include, but is not limited to, an analog filter and an amplifier circuit as are known in the art. Based upon the disclosure provided herein, one of ordinary skill in the art will recognize a variety of circuitry that may be included as part of analog front end 204. In some cases, the gain of a variable gain amplifier included as part of analog front end 204 may be modifiable, and the cutoff frequency and boost of an analog filter included in analog front end 204 may be modifiable. Analog front end 204 receives and processes the analog signal 202, and provides a processed analog signal 206 to an analog to digital converter 210.

Analog to digital converter 210 converts processed analog signal 206 into a corresponding series of digital samples 212. Analog to digital converter 210 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 212 are provided to an equalizer 214. Equalizer 214 applies an equalization algorithm to digital samples 212 to yield an equalized output 216. In some embodiments of the present invention, equalizer 214 is a digital finite impulse response filter circuit as is known in the art. Data or codewords contained in equalized output 216 may be stored in a buffer 218 until a data detector 220 is available for processing.

The data detector 220 performs a data detection process on the received input, resulting in a detected output 222. In some embodiments of the present invention, data detector 220 is a Viterbi algorithm data detector circuit, or more particularly in some cases, a maximum a posteriori (MAP) data detector circuit as is known in the art. In these embodiments, the detected output 222 contains log-likelihood-ratio (LLR) information about the likelihood that each bit or symbol has a particular value. Based upon the disclosure provided herein, one of ordinary skill in the art will recognize a variety of data detectors that may be used in relation to different embodiments of the present invention. Data detector 220 is started based upon availability of a data set in buffer 218 from equalizer 214 or another source.

The detected output 222 from data detector 220 is provided to an interleaver 224 that protects data against burst errors. Burst errors overwrite localized groups or bunches of bits. Because LDPC decoders are best suited to correcting errors that are more uniformly distributed, burst errors can overwhelm LDPC decoders. The interleaver 224 prevents this by interleaving or shuffling the detected output 222 from data detector 220 to yield an interleaved output 226 which is stored in a memory 230. The interleaved output 226 from the memory 230 is provided to a multi-level LDPC layer decoder 232 which performs parity checks on the interleaved output 226, ensuring that parity constraints established by an LDPC encoder (not shown) before storage or transmission are satisfied in order to detect and correct any errors that may have occurred in the data during storage or transmission or during processing by other components of the read channel 200.

Multiple detection and decoding iterations may be performed in the read channel 200, referred to herein as global iterations. (In contrast, local iterations are decoding iterations performed within the LDPC decoder 232.) To perform a global iteration, LLR values 234 from the LDPC decoder 232 are stored in memory 230, deinterleaved in a deinterleaver 236 to reverse the process applied by interleaver 224, and provided again to the data detector 220 to allow the data detector 220 to repeat the data detection process, aided by the LLR values 234 from the LDPC decoder 232. In this manner, the read channel 200 can perform multiple global iterations, allowing the data detector 220 and LDPC decoder 232 to converge on the correct data values.

The LDPC decoder 232 also produces hard decisions 240 about the values of the data bits or symbols contained in the interleaved output 226 of the interleaver 224. For binary data bits, the hard decisions may be represented as 0's and 1's. In a GF(4) LDPC decoder, the hard decisions may be represented by four field elements 00, 01, 10 and 11.

The hard decisions 240 from LDPC decoder 232 are deinterleaved in a hard decision deinterleaver 242, reversing the process applied in interleaver 224, and stored in a hard decision memory 244 before being provided to a user or further processed. For example, the output 246 of the read channel 200 may be further processed to reverse formatting changes applied before storing data in a magnetic storage medium or transmitting the data across a transmission channel.

Turning to FIG. 3, a multi-level LDPC layer decoder with out-of-order processing 300 is illustrated in block-diagram form in accordance with various embodiments of the present invention. The multi-level LDPC layer decoder with out-of-order processing 300 generates C2V messages from a check node processor 302 to a variable node processor 304 using min-sum based check node calculations. Incoming LLR values for data to be decoded are received on an input 306 and stored in a Q value memory 310. The memory 310 stores soft LLR input values from the input 306 and Q values of each symbol, representing the likelihood that an input symbol has the value of each element of the Galois Field. For a GF(4) LDPC decoder, the Q values consist of one hard decision and three soft LLR values, or four soft LLR values in an equivalent but alternative format.

The memory 310 yields stored Q values 312 or $Q_1(a)$ for the layer previous to the layer currently being processed, also referred to herein as the previous layer and the connected layer. An adder 314 adds the Q values 312 to previous layer C2V messages 316 or $R_{1,n}(a)$ in array fashion to produce S messages 320 or $S_n(a)$ containing total soft LLR values for the previous layer.

The S messages 320 are provided to a normalization and permutation circuit 322, which converts the format of the S messages 320 from four soft LLR values to the equivalent content but different format of one hard decision and three soft LLR values (for a GF(4) embodiment), and which applies a permutation to rearrange the variable node updated values to prepare for the check node update and to apply the permutations specified by the non-zero elements of the H matrix. For example, in a GF(4) embodiment, the four elements 0-3 of the Galois Field are 0, 1, $\alpha$, $\alpha^2$. The permutation applied by normalization and permutation circuit 322 is multiplication in the Galois Field. Element 2 ($\alpha$) multiplied by element 1 (1) equals $\alpha \times 1$ or $\alpha$, which is element 2. Similarly, element $2 \times 2 = \alpha \times \alpha = \alpha^2$, which is element 3. Element $2 \times 3 = \alpha \times \alpha^2 = 1$, which is element 1. Thus, element 2 multiplied by 1, 2 and 3 results in elements 2, 3, and 1, which are permutations of elements 1, 2 and 3. The normalization and permutation circuit 322 yields P messages 324 or $P_n(a)$ for the previous layer. The 322 also yields soft LLR values 326 which are provided to a cyclic shifter 328. Cyclic shifter 328 rearranges the soft LLR values 326 to column order, performs a barrel shift which shifts the normalized soft LLR values 326 from the previous layer to the current layer using the permutation specified by the H matrix, and which yields hard decisions 330 or $a_n^*$, calculated as $\mathrm{argmin}_a S_n(a)$.

A parity check calculator 392 calculates parity checks based on the hard decisions 330, using any suitable technique. An example of the parity check calculations is provided in U.S. patent application Ser. No. 13/227,416 filed on Sep. 7, 2011 for a "Multi-Level LDPC Layer Decoder", which is incorporated by reference herein for all purposes. The parity check calculator 392 may calculate the parity checks on input data from the Q memory 310 before any local decoding iterations, or in other words, before any V2C or C2V messages are calculated in the decoder 300.

The number of unsatisfied parity checks 394 for each layer in the H matrix are provided by the parity check calculator 392 to an out-of-order processing scheduler 390, which determines the layer processing order based at least in part on the numbers of unsatisfied parity checks 394 and which determines the circulant processing order, for example by retrieving a stored order from a ROM (not shown) in the out-of-order processing scheduler 390. The out-of-order processing scheduler 390 also controls the decoding iterations in the decoder 300, for example by retrieving the appropriate data from the Q memory 310 to be processed at various times.

The P messages 324 from the normalization and permutation circuit 322 are also provided to a shifter 332, a cyclic shifter or barrel shifter which shifts the symbol values in the normalized LLR P messages 324 to generate the next circulant sub-matrix, yielding current level P messages 334 which contain the total soft LLR values of the current layer.

The current level P messages 334 are provided to a subtractor array 336 which subtracts the current layer C2V messages 338, or $R_{2,n}(a)$, from the current level P messages 334, yielding D messages 340, or $D_n(a)$.

D messages 340 are provided to a normalization and saturation circuit 342 which converts the format of the D messages 340 from four soft LLR values to the equivalent content but different format of one hard decision and three soft LLR values, yielding new Q messages 344, or $Q_{2,n}(a)$, also referred to as V2C messages, for the current layer. The normalization and saturation circuit 342 also reduces the bit width of the Q messages 344, for example changing from 6-bit data words in section 382 of the decoder 300 to 5-bit data words to be stored in Q memory 310 in section 380.

The Q messages 344 are stored in memory 310, overwriting previous channel or calculated values for the current layer, and are also provided to a scaler and saturation circuit 346 which scales the Q messages 344 to yield scaled V2C messages 348, or $T_{2,n}(a)$, and which lowers the bit-width further, for example to 4-bit data words to be used in section 384 of the decoder 300. The saturation functions used to lower the bit-width between sections 382 and 384 may be performed in multiple steps as shown, for example reducing from 6-bit words to 5-bit words in normalization and saturation circuit 342 and then from 5-bit words to 4-bit words in scaler and saturation circuit 346, or may be performed in separate single steps, for example reducing from 6-bit words to 5-bit words in normalization and saturation circuit 342 for storage in Q memory 310 and reducing from 6-bit words to 4-bit words in scaler and saturation circuit 346 for use in section 384. Note that the bit-width of data words is increased in adder array 314, which adds 5-bit words from Q memory 310 to 4-bit words (e.g., 316) and yielding 6-bit S messages 320.

In some embodiments, V2C messages 348 are provided to a min finder circuit 350 which calculates the minimum value $\min_1(d)$, second or next minimum value $\min_2(d)$ and the index of the minimum value idx(d). The min finder circuit 350 also calculates the signs of the V2C messages 348 and tracks the sign value of each non-zero element of the H matrix and the cumulative sign for the current layer. The min finder circuit 350 yields the current layer minimum, next minimum and index values with the sign values 352 to a current layer C2V generator 354, which calculates the current layer C2V messages 338, or $R_{2,n}(a)$. The min finder circuit 350 also yields the previous layer minimum, next minimum and index values with the sign values 356 to a previous layer C2V generator 358, which calculates the previous layer C2V messages 316, or $R_{1,n}(a)$. The current layer C2V generator 354 and previous layer C2V generator 358 generate the C2V or R messages 338 and 316 based on the final state and current column index of the symbol. If the current column index is equal to the index of the minimum value, then the value of R is the second minimum value. Otherwise, the value of R is the minimum value of that layer. The sign of R is the XOR of the cumulative sign and the current sign of the symbol.

In summary, the variable node processor 304 and the check node processor 302 operate together to perform layered decoding of non-binary or multi-level data. The variable node processor 304 generates variable node to check node messages (V2C messages) and calculates perceived values based on check node to variable node messages (C2V messages). The check node processor 302 generates C2V messages and calculates checksums based on V2C messages, using a min finder circuit operable to identify a minimum, a next minimum and an index of minimum value in the V2C messages.

The saturation function applied in normalization and saturation circuit 342 and in scaler and saturation circuit 346 may be used in various embodiments to reduce bit-width from any source width to any target width. In the example embodiments disclosed herein, normalization and saturation circuit 342 and in scaler and saturation circuit 346 may be used to reduce the bit-width of a data word from 6 bits to 5 bits, from 6 bits to 4 bits, and from 5 bits to 4 bits. The saturation from 6-bit to 4-bit data words may be performed according to the following pseudo-code to achieve the results in Table 1:

TABLE 1

If input is X and output is Y, with 0 <= X <= 63, 0 <= Y <= 15:
Y = X if X <= 15
Y = 15 if X > 15

| X | Y |
|---|---|
| 63 | 15 |
| 62 | 15 |
| ... | 15 |
| 15 | 15 |
| 14 | 14 |
| ... | (Y = X) |
| 0 | 0 |

The saturation from 6-bit to 5-bit data words may be performed according to the following pseudo-code to achieve the results in Table 2:

TABLE 2

If input is X and output is Y, with 0 <= X <= 63, 0 <= Y <= 31:
Y = X if X <= 31
Y = 31 if X > 31

| X | Y |
|---|---|
| 63 | 31 |
| 62 | 31 |
| ... | 31 |
| 31 | 31 |
| 30 | 30 |
| ... | (Y = X) |
| 0 | 0 |

The saturation from 5-bit to 4-bit data words may be performed according to the following pseudo-code to achieve the results in Table 3:

TABLE 3

If input is X and output is Y, with 0 <= X <= 31, 0 <= Y <= 15:
Y = X if X <= 15
Y = 15 if X > 15

| X | Y |
|---|---|
| 31 | 15 |
| 30 | 15 |
| ... | 15 |
| 15 | 15 |
| 14 | 14 |
| ... | (Y = X) |
| 0 | 0 |

Figure 4:
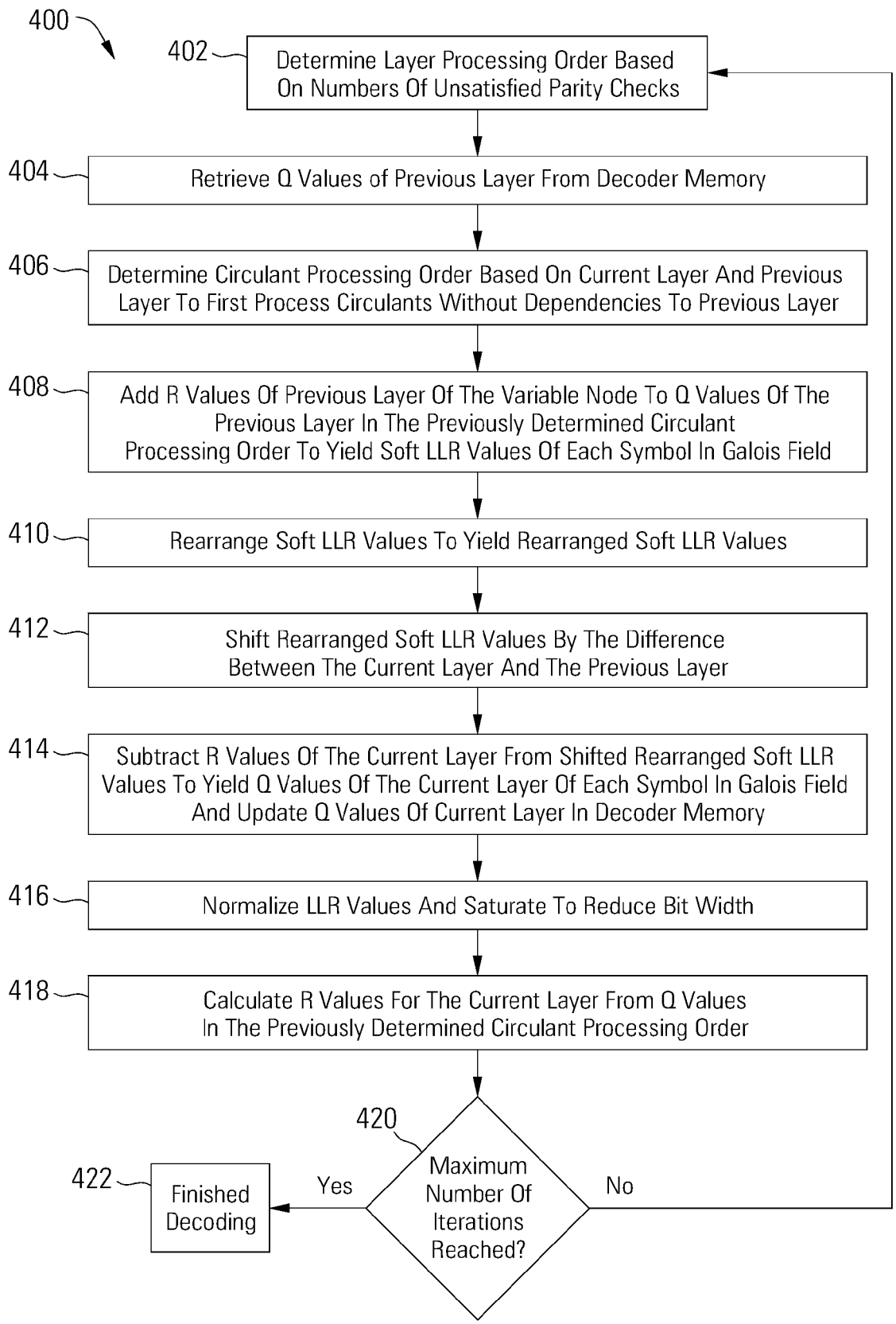
FIG. 4 depicts a flow diagram showing a method for multi-level layer LDPC decoding with out-of-order processing in accordance with various embodiments of the present invention.

Turning to FIG. 4, a flow diagram 400 depicts a method for layered multi-level LDPC decoding with out-of-order processing using a low bit-width architecture in accordance with various embodiments of the present invention. The method of FIG. 4, or variations thereof, may be performed in data decoding circuits such as those illustrated in FIG. 3. Following flow diagram 400, the layer processing order is determined based at least in part on the numbers of unsatisfied parity checks for each layer. (Block 402) The Q values of the previous layer of the H matrix are retrieved from the decoder memory. (Block 404) The circulant processing order is determined based on the current layer and the previous layer in order to first process circulants without dependencies to the previous layer. (Block 406) R values of the previous layer of the variable node are added to Q values of the previous layer to yield soft LLR values of each symbol in Galois Field. (Block 408) The soft LLR values are rearranged to yield rearranged soft LLR values. (Block 410) The rearranged soft LLR values are shifted by the difference between the current layer and the previous layer. (Block 412) R values of the current layer are subtracted from the shifted rearranged soft LLR values to yield Q values of the current layer of each symbol in Galois Field, and Q values of current layer are updated in the decoder memory. (Block 414) The LLR values are normalized and saturated to reduce bit width. (Block 416) For example, the normalization may change messages from a format with all soft LLR values to a format with one hard decision and with the remaining soft LLR values normalized to the hard decision value. R values are calculated for the current layer from Q values in the previously determined circulant processing order. (Block 418) In some min-sum based embodiments, this includes calculating the minimum, next minimum and index of minimum from Q values of the current layer, and calculating R values of the current layer and the previous layer from the minimum, next minimum, index of minimum, and Q value signs. If the current column index is equal to the index of the minimum value, then the value of R is the second minimum value. Otherwise, the value of R is the minimum value of that layer. The sign of R is the XOR of the cumulative sign and the current sign of the symbol.

A determination is made as to whether the maximum number of iterations has been reached in the decoder. (Block 420) If so, decoding is finished. (Block 422) If not, decoding continues at block 402.

Low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives. Although the multi-level LDPC layer decoder disclosed herein is not limited to any particular application, several examples of applications are presented herein that benefit from embodiments of the present invention.

Figure 5:
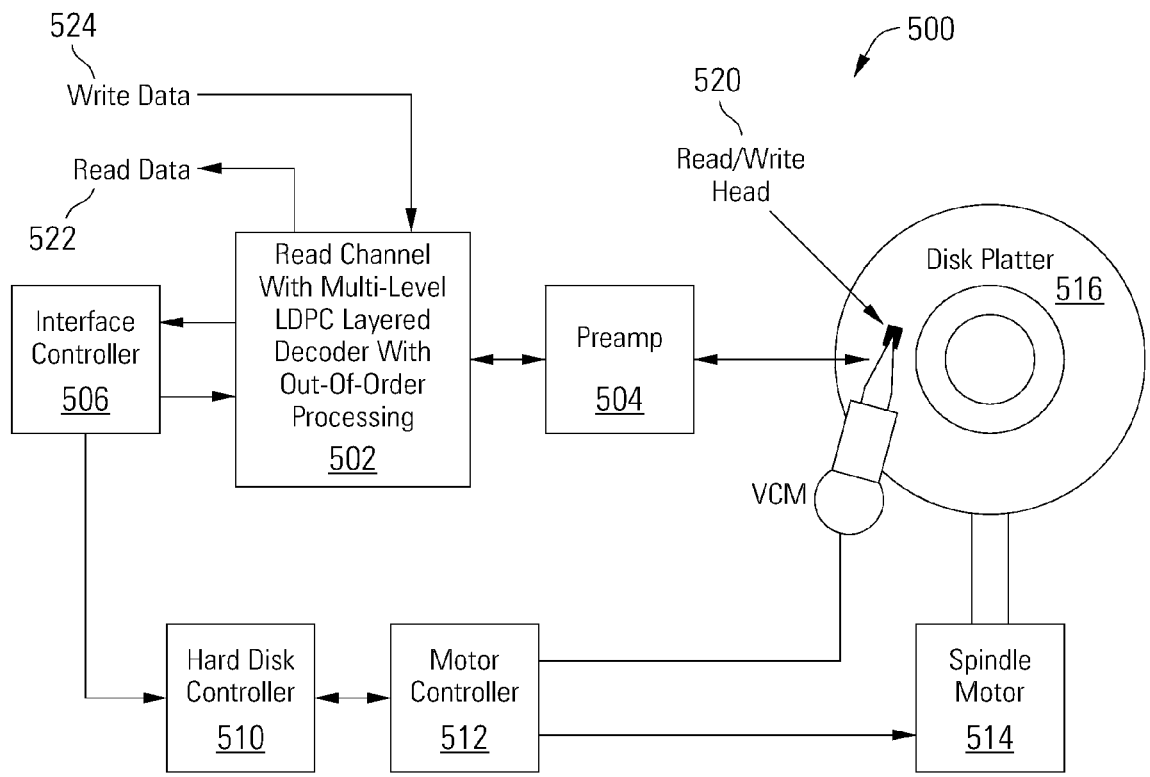
FIG. 5 depicts a storage system including a multi-level LDPC layer decoder with out-of-order processing in accordance with some embodiments of the present invention.

Turning to FIG. 5, a storage system 500 including a read channel circuit 502 having a multi-level LDPC layered decoder with out-of-order processing is shown in accordance with various embodiments of the present invention. Storage system 500 may be, for example, a hard disk drive. Storage system 500 also includes a preamplifier 504, an interface controller 506, a hard disk controller 510, a motor controller 512, a spindle motor 514, a disk platter 516, and a read/write head 520. Interface controller 506 controls addressing and timing of data to/from disk platter 516. The data on disk platter 516 consists of groups of magnetic signals that may be detected by read/write head assembly 520 when the assembly is properly positioned over disk platter 516. In one embodiment, disk platter 516 includes magnetic signals recorded in accordance with either a longitudinal or a perpendicular recording scheme.

In a typical read operation, read/write head assembly 520 is accurately positioned by motor controller 512 over a desired data track on disk platter 516. Motor controller 512 both positions read/write head assembly 520 in relation to disk platter 516 and drives spindle motor 514 by moving read/write head assembly to the proper data track on disk platter 516 under the direction of hard disk controller 510. Spindle motor 514 spins disk platter 516 at a determined spin rate (RPMs). Once read/write head assembly 520 is positioned adjacent the proper data track, magnetic signals representing data on disk platter 516 are sensed by read/write head assembly 520 as disk platter 516 is rotated by spindle motor 514. The sensed magnetic signals are provided as a continuous, minute analog signal representative of the magnetic data on disk platter 516. This minute analog signal is transferred from read/write head assembly 520 to read channel circuit 502 via preamplifier 504. Preamplifier 504 is operable to amplify the minute analog signals accessed from disk platter 516. In turn, read channel circuit 502 decodes and digitizes the received analog signal to recreate the information originally written to disk platter 516. This data is provided as read data 522 to a receiving circuit. As part of decoding the received information, read channel circuit 502 processes the received signal using a multi-level LDPC layer decoder with out-of-order processing. Such a multi-level LDPC layer decoder with out-of-order processing may be implemented consistent with that disclosed above in relation to FIG. 3. In some cases, the multi-level layered LDPC decoding with out-of-order processing may be done consistent with the flow diagram disclosed above in relation to FIG. 4. A write operation is substantially the opposite of the preceding read operation with write data 524 being provided to read channel circuit 502. This data is then encoded and written to disk platter 516. It should be noted that various functions or blocks of storage system 500 may be implemented in either software or firmware, while other functions or blocks are implemented in hardware.

Storage system 500 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 500, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

Figure 6:
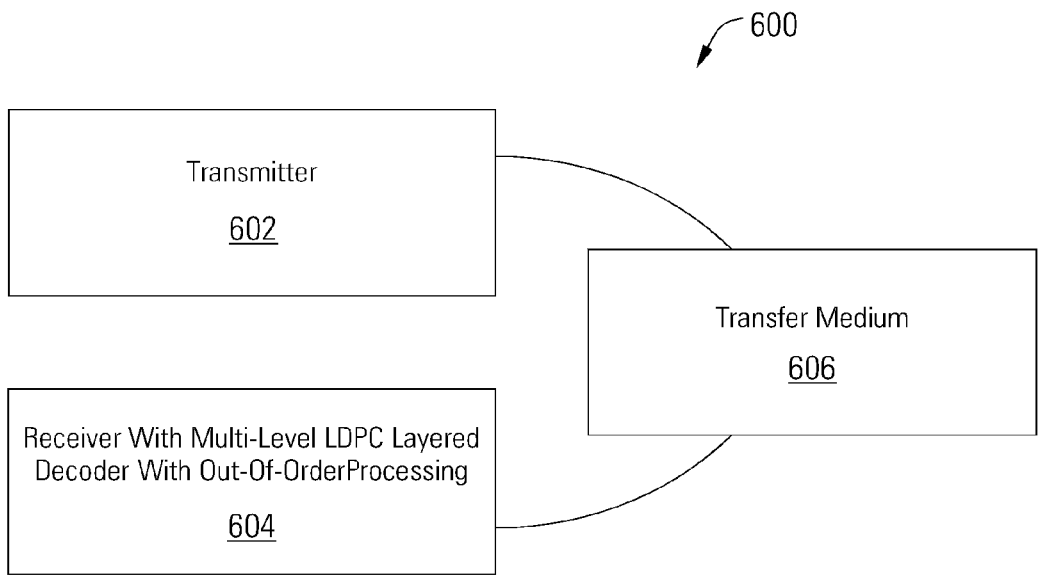
FIG. 6 depicts an example data transmission device including a multi-level LDPC layer decoder with out-of-order processing in accordance with some embodiments of the present invention.

Turning to FIG. 6, a data transmission system 600 including a receiver 604 having a multi-level LDPC layer decoder with out-of-order processing is shown in accordance with various embodiments of the present invention. Data transmission system 600 includes a transmitter 602 that is operable to transmit encoded information via a transfer medium 606 as is known in the art. The encoded data is received from transfer medium 606 by a receiver 604. Receiver 604 processes the received input to yield the originally transmitted data. As part of processing the received information, receiver 604 decodes received data with a multi-level LDPC layer decoder with out-of-order processing. In some cases, receiver 604 may be implemented to include a multi-level LDPC layer decoder with out-of-order processing similar to that disclosed in relation to FIG. 3. Further, the multi-level LDPC layer decoding with out-of-order processing may be accomplished consistent with the approach disclosed in relation to FIG. 4.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the present invention provides novel methods and apparatuses for layered multi-level LDPC decoding with out-of-order processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An apparatus for low density parity check decoding comprising:
   a variable node processor operable to generate variable node to check node messages and to calculate perceived values based on check node to variable node messages;
   a check node processor operable to generate the check node to variable node messages and to calculate checksums based on the variable node to check node messages; and
   a scheduler operable to determine a layer processing order for the variable node processor and the check node processor based at least in part on a number of unsatisfied parity checks for each of a plurality of H matrix layers, wherein the scheduler is operable to determine a circulant processing order by reading it from a memory, and wherein the memory comprises a circulant processing order for each pair of current and previous layers in the plurality of H matrix layers.

2. The apparatus of claim 1, further comprising a parity check calculator operable to calculate the number of unsatisfied parity checks for each of the plurality of H matrix layers.

3. The apparatus of claim 1, wherein the layer processing order determined by the scheduler is in decreasing order of the number of unsatisfied parity checks.

4. An apparatus for low density parity check decoding comprising:
   a variable node processor operable to generate variable node to check node messages and to calculate perceived values based on check node to variable node messages;
   a check node processor operable to generate the check node to variable node messages and to calculate checksums based on the variable node to check node messages; and
   a scheduler operable to determine a layer processing order for the variable node processor and the check node processor based at least in part on a number of unsatisfied parity checks for each of a plurality of H matrix layers, wherein the scheduler is operable to determine a circulant processing order, wherein the circulant processing order comprises a first group of circulants without dependencies to a previously processed layer and a second group of circulants with dependencies to the previously processed layer, and wherein the first group of circulants is before the second group of circulants in the circulant processing order.

5. The apparatus of claim 4, wherein the first group of circulants is processed in column order and wherein the second group of circulants is processed in column order.

6. The apparatus of claim 1, wherein the variable node processor comprises a saturation circuit operable to reduce a bit width of the variable node to check node messages.

7. The apparatus of claim 1, wherein the check node processor comprises a saturation circuit operable to reduce a bit width of the variable node to check node messages.

8. The apparatus of claim 1, further comprising an input memory, wherein the input memory, the variable node processor and the check node processor each have a different data word bit width.

9. The apparatus of claim 1, wherein the apparatus is implemented as an integrated circuit.

10. The apparatus of claim 1, wherein the apparatus is incorporated in a storage device.

11. The apparatus of claim 1, wherein the apparatus is incorporated in a storage system comprising a redundant array of independent disks.

12. The apparatus of claim 1, wherein the apparatus is incorporated in a data transmission device.

13. A method of decoding data in a low density parity check layer decoder, comprising:
   performing parity check calculations for each of a plurality of layers of an H matrix to yield a number of unsatisfied parity checks for each of the plurality of layers;
   determining a layer processing order based at least in part on the number of unsatisfied parity checks for each of the plurality of layers;
   determining a circulant processing order for each of the plurality of layers based at least in part on a previously processed one of the plurality of layers, wherein circulants having dependencies to the previously processed one of the plurality of layers are placed at a later end of the circulant processing order; and
   decoding each of the plurality of layers according to the circulant processing orders.

14. The method of claim 13, wherein determining the circulant processing order comprises reading a predetermined order from a memory.

15. The method of claim 13, wherein the decoding comprises changing a bit width of variable node to check node messages.

16. The apparatus of claim 4, further comprising a parity check calculator operable to calculate the number of unsatisfied parity checks for each of the plurality of H matrix layers.

17. The apparatus of claim 4, wherein the layer processing order determined by the scheduler is in decreasing order of the number of unsatisfied parity checks.

18. The apparatus of claim 4, wherein the check node processor comprises a saturation circuit operable to reduce a bit width of the variable node to check node messages.

19. The apparatus of claim 4, further comprising an input memory, wherein the input memory, the variable node processor and the check node processor each have a different data word bit width.

20. The apparatus of claim 4, wherein the apparatus is incorporated in a storage device.

* * * * *